United States Patent [19]

Hou et al.

[11] Patent Number: 5,440,753
[45] Date of Patent: Aug. 8, 1995

[54] VARIABLE LENGTH STRING MATCHER

[75] Inventors: Brian T. Hou, Freehold, N.J.; Craig D. Cohen, Merrick, N.Y.; James A, Pasco-Anderson, Needham; Michael Gutman, Newton, both of Mass.

[73] Assignee: Motorola, Inc., Schaumburg, Ill.

[21] Appl. No.: 209,812

[22] Filed: Mar. 11, 1994

Related U.S. Application Data

[63] Continuation of Ser. No. 976,298, Nov. 13, 1992, Pat. No. 5,329,405.

[51] Int. Cl.⁶ .............................................. G06F 7/00
[52] U.S. Cl. .................... 395/800; 364/229.2; 364/259.2; 364/956.1; 364/966; 364/DIG. 1
[58] Field of Search .................... 395/800; 382/14, 11; 365/11, 189.07; 341/52, 95

[56] References Cited

U.S. PATENT DOCUMENTS

| | | | |
|---|---|---|---|
| 3,465,299 | 9/1969 | Schellenberg | 340/172.5 |
| 3,568,156 | 3/1971 | Thompson | 340/172.5 |
| 4,164,025 | 8/1979 | Dubnowski et al. | 364/900 |
| 4,205,302 | 5/1980 | Godo | 340/146.2 |
| 4,285,049 | 9/1981 | Bird et al. | 364/900 |
| 4,446,452 | 5/1984 | Munter | 340/146.2 |
| 4,453,217 | 6/1984 | Boivie | 364/300 |
| 4,539,549 | 9/1985 | Hong et al. | 340/146.2 |
| 4,550,387 | 10/1985 | Takita | 364/900 |
| 4,558,302 | 12/1985 | Welch | 340/347 |
| 4,625,295 | 11/1986 | Skinner | 364/900 |
| 4,689,768 | 8/1987 | Heard et al. | 364/900 |
| 4,760,523 | 7/1988 | Yu et al. | 364/200 |
| 4,897,814 | 1/1990 | Clark | 365/49 |
| 5,014,327 | 5/1991 | Potter et al. | 382/14 |
| 5,245,338 | 9/1993 | Ming-Ting Sun | 341/67 |

FOREIGN PATENT DOCUMENTS

| | | |
|---|---|---|
| 1574599 | 9/1971 | Germany . |
| 2857403 | 8/1980 | Germany . |
| 3149926 | 8/1982 | Germany . |
| 3246432 | 6/1983 | Germany . |

OTHER PUBLICATIONS

World Patent Index, Enhanced English Language Abstract (For German Patent No. DE3149926A1).
European Patent Search Report MJPD/33810.
Adams et al., "A Parallel General Purpose CAM Architechure," Advanced Research in VLSI, Proceedings of the Fourth MIT Conference, pp. 51-72 (1986).
Gonzalez Smith et al., "Parallel Algorithms for Data Compression," J. of the Asso. for Computing Machinery, 32; pp. 344-373 (1965).
Robinson, "The Sum: An Al CO-Processor," Byte, pp. 169-180 (1985).
Vishkin, "Optimal parallel pattern matching in strings," Proc. twelfth ICALP Lecture Notes in Computer Science 194, Springer Verlag, 497-508.
Ziv et al., "A Universal Algorithm for Sequential Data Compression,"]IEEE Trans. Information Theory, 23 pp. 337-343 (1977).
Karp et al., "Rapid identification of Repeated Patterns in Strings, Trees and Arrays," Proc. of the 4th ACM Symposium of Theory of Computing, 125-1 (1972).

*Primary Examiner*—Eric Coleman
*Attorney, Agent, or Firm*—Darleen J. Stockley

[57] ABSTRACT

A variable length string matcher uses absolute addressing of a history buffer; the longest matching string is determined by an associative content addressable memory.

4 Claims, 11 Drawing Sheets

VARIABLE LENGTH STRING MATCHER

This is a continuation of application Ser. No. 07/976,298, filed on Nov. 13, 1992, now U.S. Pat. No. 5,329,405.

BACKGROUND OF THE INVENTION

This invention relates to string matching.

String matching, in which the characters of one data string are matched against characters of another data string, is useful in, e.g., data compression algorithms of the kind found in data communication systems using statistical multiplexers and modems.

Referring to FIG. 1, in a classic data communication system 10 using data compression techniques, data from a sender 12 undergoes compression 14, and the compressed data is transmitted via a communication medium 16 (in FIG. 1 assumed to be an error-free communication channel). At the other end of the channel, the compressed data is decompressed 20 to recover the original data stream.

In high-bandwidth communication networks the very substantial benefits of real-time data compression tend to be offset by the computational cost associated with the compression and decompression processes.

Among known data compression algorithms is the Ziv-Lempel '77 algorithm (ZL77 for short), which belongs to the class of variable-length input and fixed-length output (V-F class) data compression algorithms.

The ZL77 algorithm is based on the simple observation that, in a continuous data stream, some data occur more than once and in particular may occur more than once within a local region of the data stream. For example, in a stream of text data, the word "the" is likely to appear frequently. If the data source keeps track of the history of data recently sent (by storing it in a so-called history buffer), it can find redundant occurrences of a sequence of data by comparing successive elements of the current data to be sent with successive elements of the stored historical data. The process of comparison is called variable length string matching. When a match is found, the sender, instead of again sending the full redundant sequence, encodes that sequence as a codeword which points to the location of the earlier occurrence of the redundant data sequence in the history buffer and refers to its length. Data compression is achieved if the number of bits required to represent the codeword is less than the number of bits required to represent the redundant data sequence. At the other end of the channel a decoder, which similarly maintains a history buffer of recently sent data, the codeword is decoded by referring to the specified place in the history buffer.

Referring to FIG. 2, for example, a history buffer 11 has 16 cells (13), which are numbered to indicate the order in which the characters of the data stream have appeared (lower numbered cells hold more recent data characters.) Data characters waiting to be sent are shown to the right of the history buffer. The next six characters to be sent are S U P E R B. ZL77 determines that the first five of these waiting characters, S U P E R are redundant with a like string in the history buffer, and can be encoded as a codeword 15 consisting of Index, Length, and Innovation Character fields. Index 17 has a value of 12 indicating how many characters back in the history buffer the matching string begins; Length 19 has a value of 5 and shows the length in characters of the match; and Innovation Character 21 is the first character in the waiting input string of characters that did not match the string in the history buffer.

Referring to FIG. 3, after transmitting the codeword, the data source updates its history buffer by effectively sliding old data 23 to the left and inserting the recent input data into the right of the history buffer. The process then begins again with the data source encoding the next input data.

Referring to FIG. 4, the data receiver maintains a duplicate history buffer 25 and updates it in the same way as the sender updated its history buffer. Upon receiving a codeword, the receiver uses the Index field to find the location of the longest match, and the Length to determine how many characters to read from the history buffer, also taking the Innovation Character as it appears in the codeword. Then, as shown in FIG. 5, having decoded the codeword, the receiver updates its history buffer by effectively sliding the characters in the history buffer to the left and inserting the decoded characters and Innovation Character from the right.

One hardware architecture capable of implementing string matching algorithms is content addressable memory (CAM). CAM consists of a number of cells which can store data and access the cells by their contents. During a read cycle, CAM takes data as input and outputs the address where the data is found.

SUMMARY OF THE INVENTION

In one aspect, the invention features finding, within a stored sequence of data elements, the longest string of stored data elements that matches a second string of given data elements; the matching sequence is found by storing the sequence of data elements; comparing a data element of the second string with corresponding elements of the sequence; issuing signals when matches are found; causing the comparisons to be made iteratively, each iteration involving a comparison of a data element of the second string with the data elements in the storage locations; and determining the longest matching string based on when an iteration does not result in issuance of a match signal by the comparison circuitry.

Preferred embodiments include the following features. In the storage, each storage location holds one of the data elements of the sequence, all data elements of the sequence are compared with a given data element of the second string, a signal issued as a result of a comparison is stored temporarily and thereafter made available for use in comparing the adjacent data element of the sequence with the next given data element of the second string. The issuance of the match signal is inhibited except when the temporarily stored signal for the adjacent data element indicates a match. The number of iterations is counted, ending with an iteration that does not result in a match signal, and the number of data elements of the longest matching string is determined based on the count. The iterations may be stopped after a counter reaches a predetermined value. The scheme is implemented by an associative content addressable memory. The data elements may be 8-bit bytes. The longest string is encoded as a codeword and subsequently decoded to recover the longest string.

In another aspect, the invention features identifying, within a stored sequence of data elements, a string of data elements that matches a given second string of data elements; the matching string is identified by absolute addressing.

Preferred embodiments include the following features. All stored elements of the data sequence are compared with a given data element of the second string, and the absolute address of one addressable storage location having a match is retained in each iteration of the comparison process. The one addressable storage location is chosen arbitrarily by an arbitrary rule applied in each iteration. The encoding of the matching second string as a codeword is based on the absolute address. The codeword includes values indicative of the length and location of the matched string.

The invention enables rapid and efficient variable length string matching, encoding, and decoding. The number of steps required for string matching is dependent on the length of the string being matched. Implementation is possible on VLSI chips using content addressable memory techniques.

Other advantages and features will become apparent from the following description of the preferred embodiment, and from the claims.

DESCRIPTION OF THE PREFERRED EMBODIMENT

We first briefly describe the drawings.

STRUCTURE AND OPERATION

Figure 1:
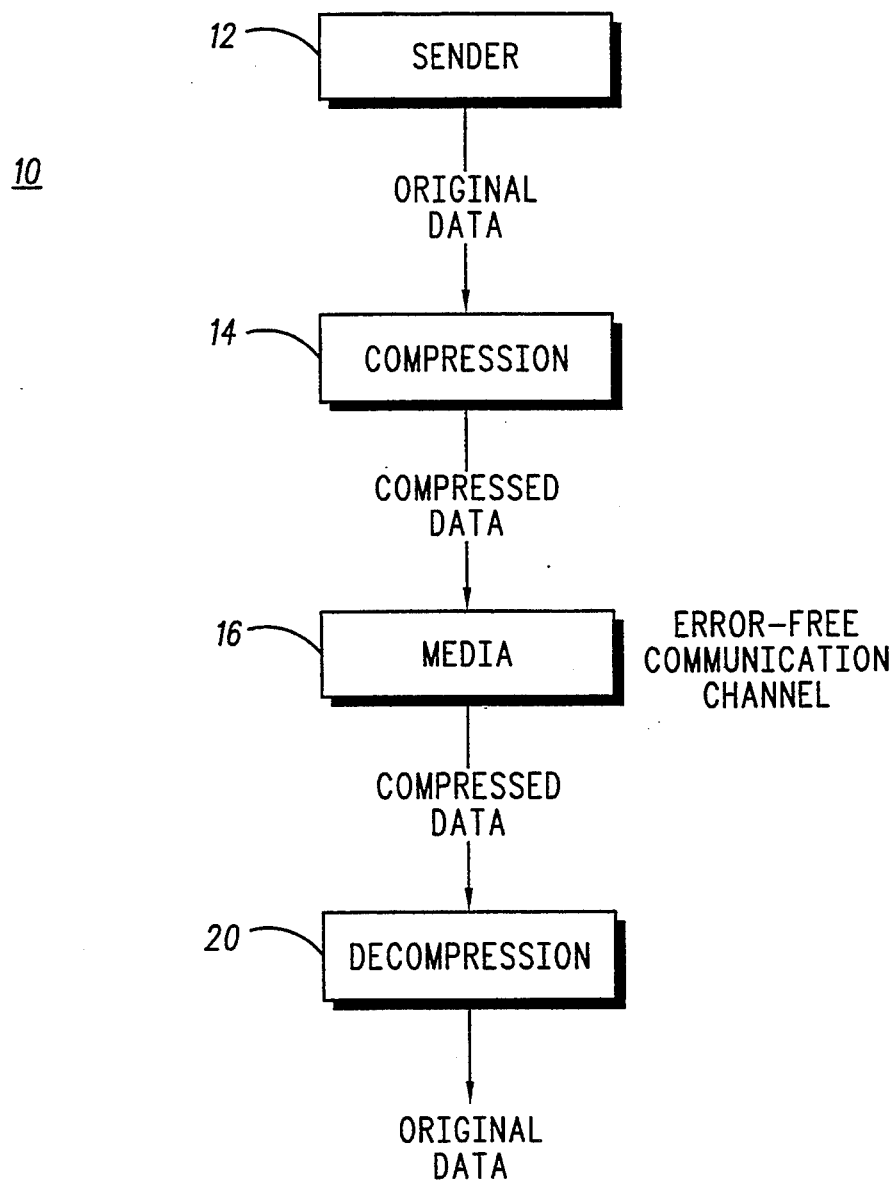
FIG. 1 is a block diagram of a data transmission system using data compression.
Figure 2:
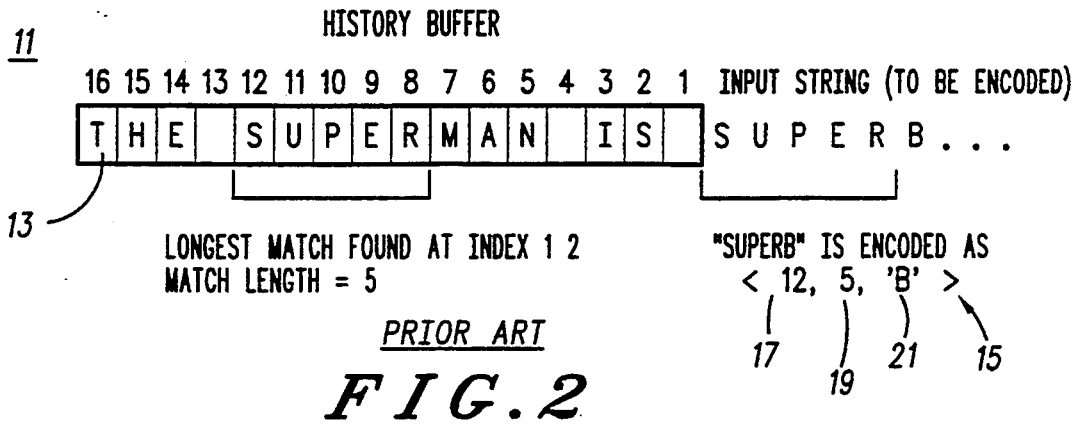
FIGS. 2, 3, 4, 5 are diagrams illustrating the compression and decompression procedures in the ZL77 algorithm.
Figure 3:
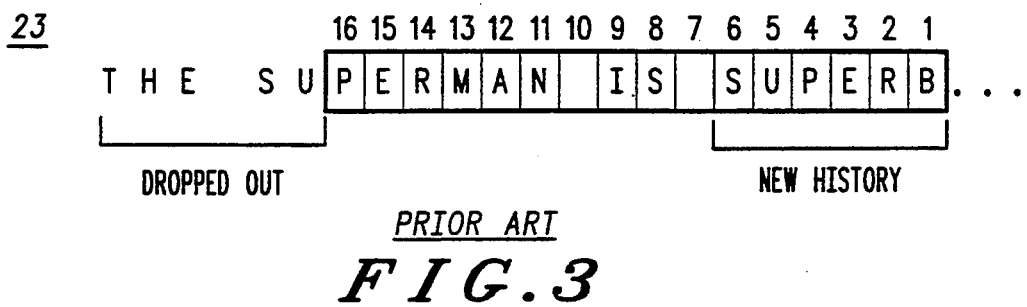
Figure 4:
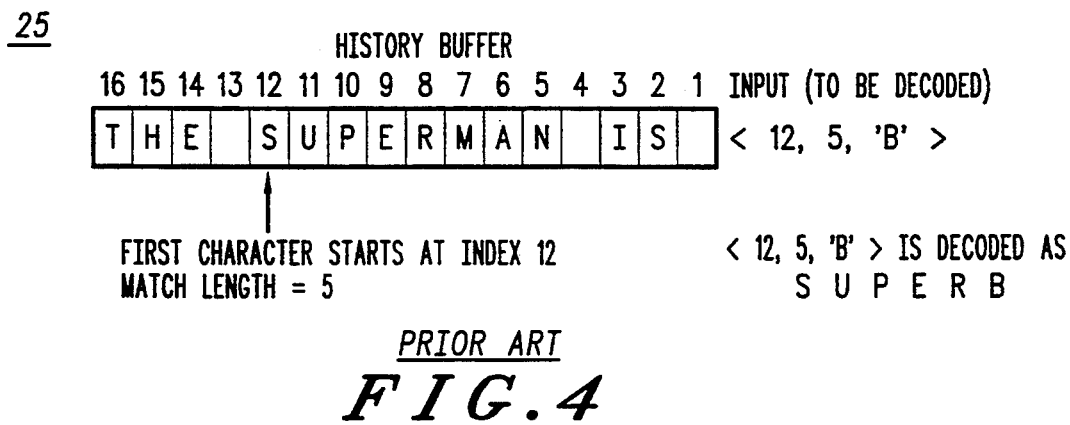
Figure 5:
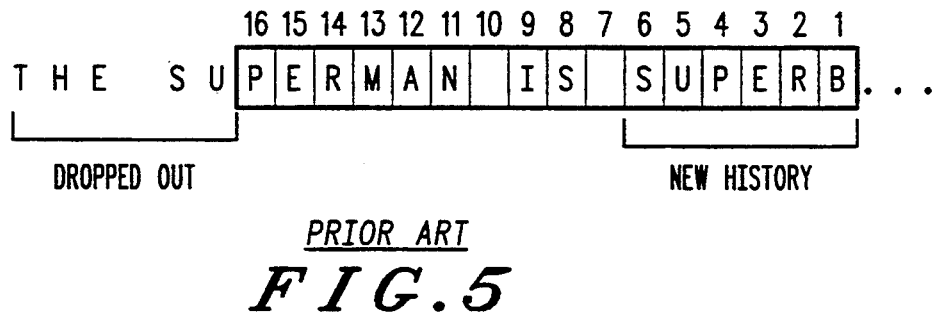
Figure 6:
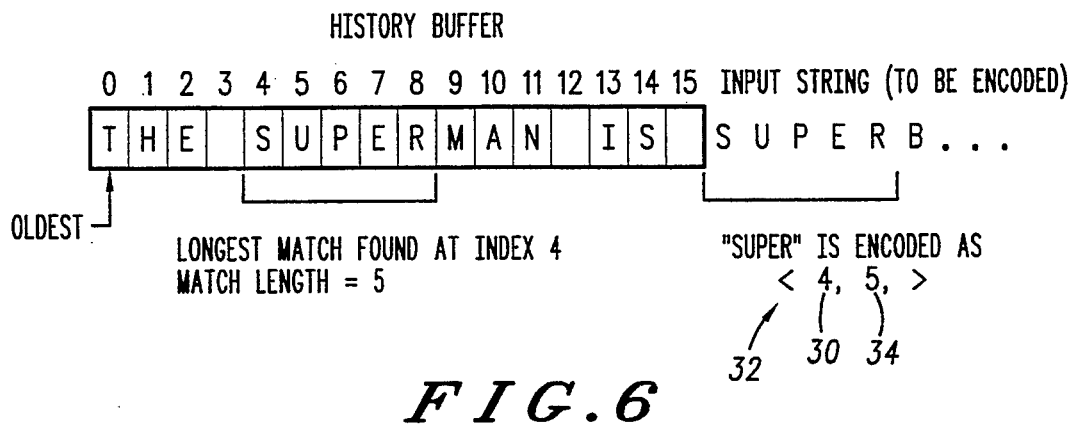
FIG. 6 is a diagram of a modified ZL77 algorithm.

In the invention, the ZL77 algorithm is modified by providing absolute indexing of the location of the matching string in the history buffer. Referring to FIG. 6, the Index portion 30 of the codeword 32 now has the value 4, specifying the absolute location in the history buffer where the longest match begins, rather than its location relative to the most recent character in the buffer as in the classical ZL77 algorithm. The Length 34 again has the value 5, so the sender transmits the codeword 4, 5. The receiver uses the Index as a pointer to history buffer without having to perform the subtraction necessary in relative indexing.

Figure 7:
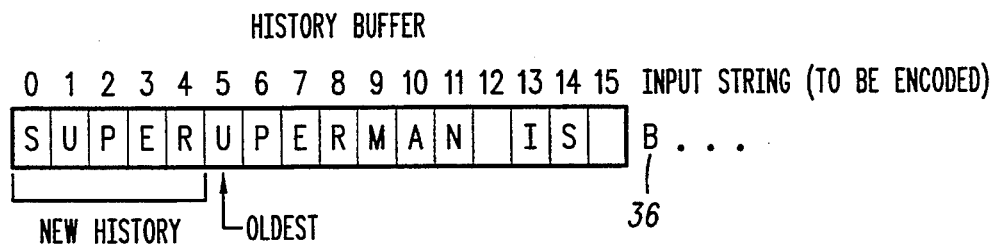
FIG. 7 is a diagram of a modified ZL77 algorithm after updating.

In the present invention, in cases of no match (i.e. Length=0), the sender puts the data sequence's 8-bit raw character (e.g. ASCII or EBCIDIC message) into the Index field and places a 0 in the Length field. The receiver, upon detecting a Length of 0, takes the raw character from the Index field without reading from the history buffer and without requiring a flag to distinguish data from pointers. In the present invention, the Innovation Character is not encoded as a part of a codeword. Rather, referring to FIG. 7, it becomes the first character 36 of the next input string to be encoded.

Figure 8:
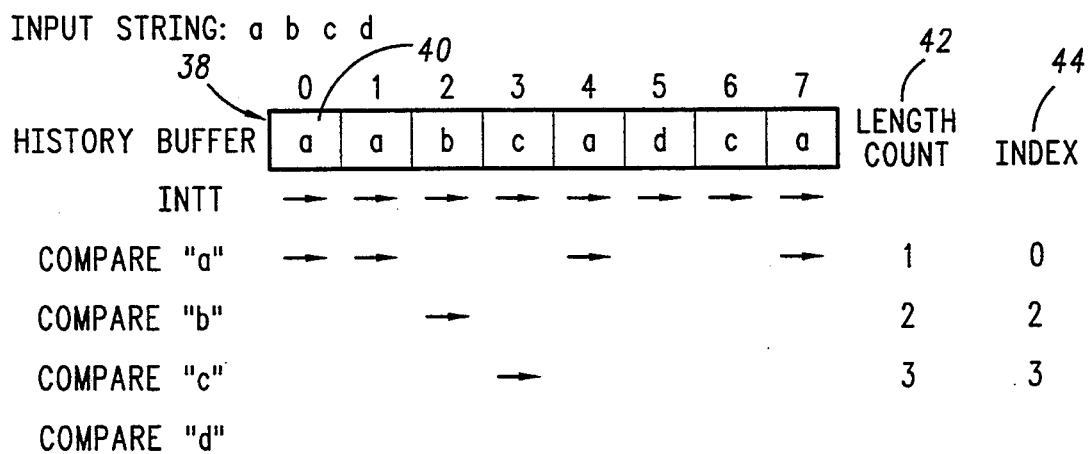
FIG. 8 is a diagram of the modified ZL77 algorithm implemented using a systolic array.

In another aspect of the invention, the modified ZL77 algorithm uses a modified content addressable memory as the mechanism for maintaining and searching the history buffers. Referring to FIG. 8, the history buffer is formed as an array 38 of eight simple processors 40, numbered from 0 to 7. Each processor has a comparator and a local memory (not shown). All of the processors have simultaneous access to the common data bus (not shown) on which the character stream appears.

Assume in FIG. 8 that the present data string (character stream) awaiting transmission is a b c d. The processors operate synchronously in cycles. In a so-called COMPARE cycle, a processor asserts a 'hit' if (1) the character in the processor's memory matches the current character on the data bus, and (2) the left neighbor of the processor had asserted a hit in the previous COMPARE cycle. (The modified algorithm initializes the array by forcing each processor to assert a hit (INIT cycle). Hits are shown in FIG. 8 as arrows under the processors.) When character "a" is sent over the data bus to every processor (COMPARE "a" cycle), processors 0, 1, 4, and 7 indicate hits (arrows) because their contents match the character "a" and their left neighbors had hits in the previous (INIT) cycle. The modified algorithm then increments a Length counter 42 which keeps track of the match length. At the same time, the index 44 of one of the cells which has a hit is recorded. Because multiple cells may have hits, by rule the modified algorithm simply records the index of the leftmost processor which has a hit.

In the second COMPARE cycle, "b" is sent over the data bus to be compared and only processor 2 asserts a hit. The algorithm again increments the Length counter and records the index of the leftmost processor (2) having a hit.

In the third COMPARE cycle, "c" is sent over the data bus to be compared and only processor 3 asserts a hit, even though processor 6 contains "c". This is because processor 5, the left neighbor of processor 6, did not assert a hit in the previous COMPARE cycle. Once again, the algorithm increments the Length counter and records the Index of the leftmost processor to hit.

On the fourth COMPARE cycle, "d" is sent over the data bus to be compared. No processors assert a hit, which indicates that the longest match has been found.

At this point, the absolute index 44 indicates where the last matching character can be found. The first matching character is found by subtracting the match Length from the absolute Index and adding one. In this example, the longest match begins at index=3−3+1, or 1. Therefore, the sender encodes and transmits the "abc" as 1,3.

Using the two criteria for a match in a given processor isolates strings that have the potential to be the longest match. Significantly, the search time does not depend on history buffer size, but rather on match length. For example, if L is the match length, then we only need to compare (L+1) characters to find the longest match, which is much faster than traditional hashing or tree search data structures.

In contrast to the systolic array implementation (described in M. E. Gonzalez Smith and J. A. Storer, "Parallel Algorithms For Data Compression," Journal of the Asso. for Computer Machinery, Vol. 32, No. 2, April 1985, pp. 344–373) which also has high throughput, this algorithm has noticeably lower latency; because all CAM cells simultaneously compare their contents with the same input character, the codeword can be produced as soon as the longest match is found. In the classic systolic array, the latency is always proportional to the size of the history buffer, which can be unacceptably long in certain applications.

Figure 9:
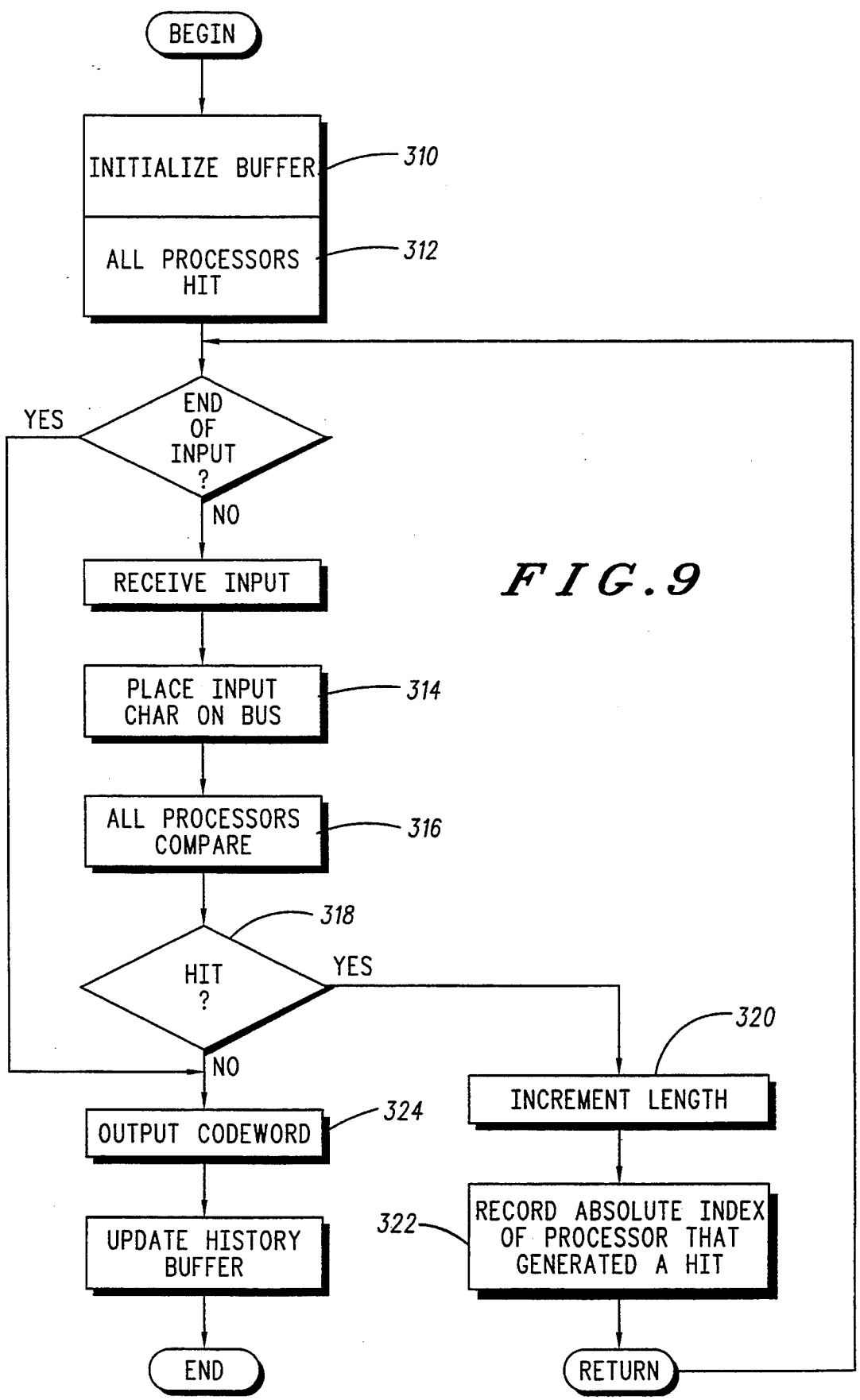
FIG. 9 is a flowchart of the modified algorithm.

FIG. 9 shows a flowchart of the modified algorithm.

One hardware architecture capable of implementing the algorithm is Content Addressable Memory (CAM). CAM, also known as associative memory, has cells which can store data and which can be accessed based on their content (rather than their address as in conventional memories), and deliver back the address where the data was found.

Figure 10:
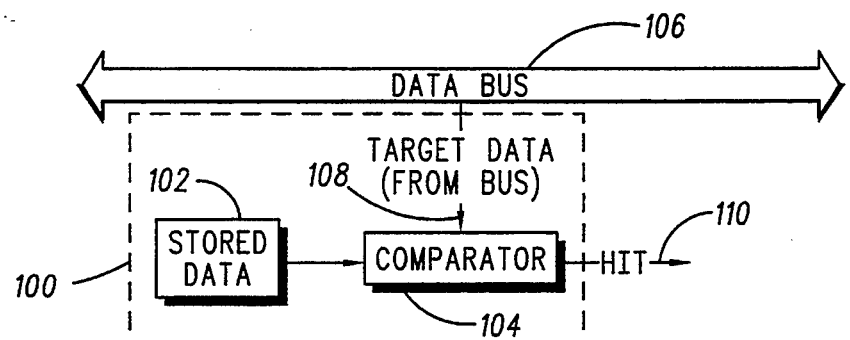
FIG. 10 is a block diagram of a classic CAM cell structure.

Referring to FIG. 10, in a classic CAM structure, each CAM cell 100 (corresponding to one of the simple processors of FIG. 8) has both a memory element 102 and a comparator 104. Each cell can be addressed. A global data bus 106, connected to the CAM cells, carries data (the character stream) to every cell. When the data in the CAM memory element matches the data sent along the bus 108, the CAM cell asserts a HIT signal 110 to indicate the match.

Figure 11:
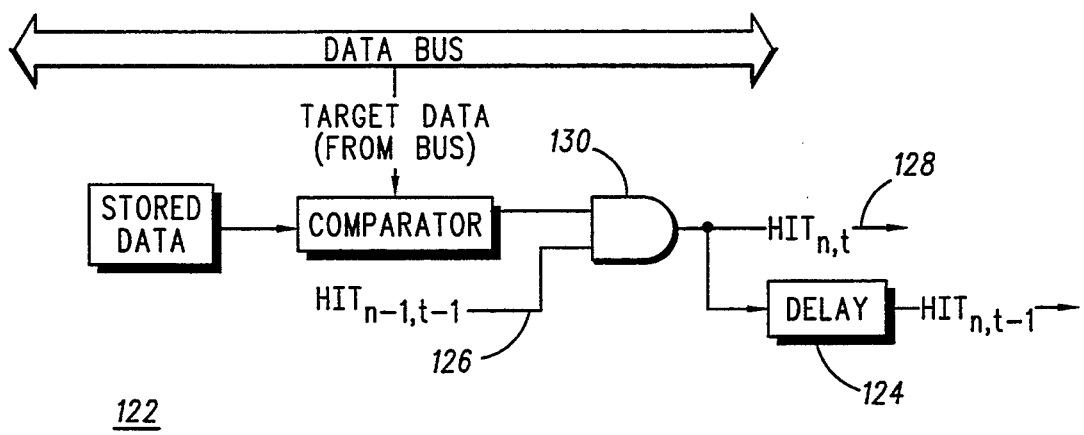
FIG. 11 is a diagram of a modified CAM cell structure.

Referring to FIG. 11, in the invention a modified CAM cell 122 includes a delay 124 (a flip flop) which enables each cell to pass the delayed hit 128 to its right-hand neighbor. Each cell receives the delayed match result from the left-hand neighbor on a line 126.

The HIT signal 128 is the logical AND 130 of the content match result of that cell and the hit signal of the left neighbor (n−1) in the previous cycle (t−1). $HIT_{n-1,t-1}$ is the match result of the left neighbor in the previous compare cycle, and $HIT_{n,t-1}$ is the match result of the CAM cell n in the previous compare cycle. The Delay 124 delivers the input signal to its output one compare cycle later.

Figure 12:
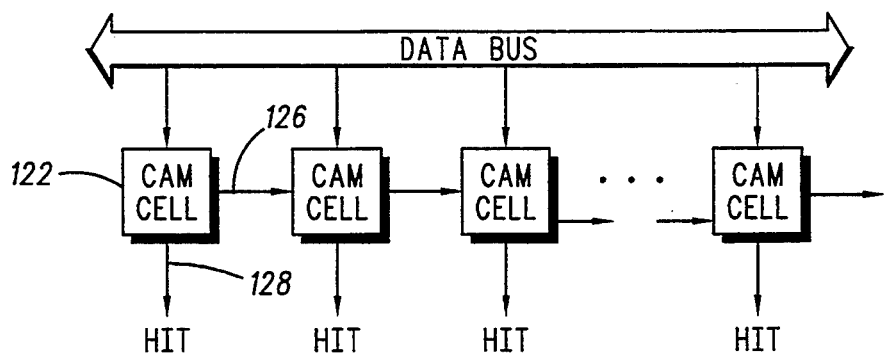
FIG. 12 is a diagram of a modified fully parallel CAM structure.

Referring to FIG. 12, the delayed HIT signal 126 of each CAM cell is interconnected only with its neighboring cells. These modifications implement the two criteria for a match; additional control logic is required to determine the address of the longest match.

Figure 13:
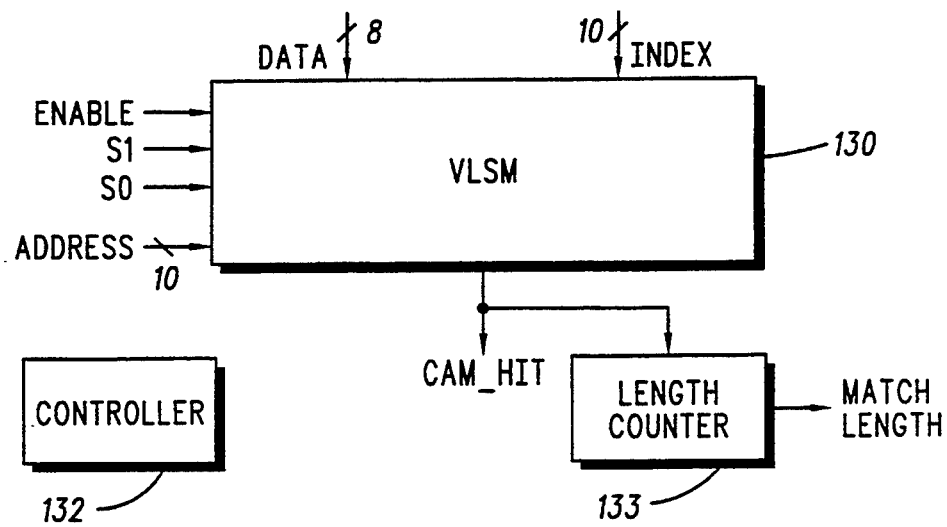
FIG. 13 is a functional block diagram of VLSM hardware.

Referring to FIG. 13, the CAM structure of FIG. 12 forms part of a variable length string matcher (VLSM) 130.

Four distinct operations are required for the encoding and updating processes using the byte associative CAM, namely INIT, COMPARE, OUTPUT, and UPDATE.

INIT is used only once for each string encoding to force a hit from every CAM cell to set up for the first COMPARE cycle; it does not clear the cell contents. In a COMPARE cycle, a character of the input string is put on the data bus for every CAM cell to check. If at least one match occurs, another COMPARE cycle begins with the next character of the input string. The codeword which consists of Index and Length components is generated during the OUTPUT cycle. Finally, one character is inserted into the history buffer by each UPDATE cycle; they are repeated until the entire matched string is written into the buffer.

Therefore, the VLSM has the following inputs and outputs: an 8-bit data bus DATA[7:0] to carry the stream of characters (bytes), a 10-bit address bus ADDRESS[9:0] (assuming a 1024 cell long history buffer), an ENABLE line and two select lines S1,S0. DATA[7:0] contains the character to be compared or updated. ADDRESS[9:0] specifies the history buffer location into which a character (byte) is inserted.

When ENABLE is asserted, the combination of the two function mode select signals S1 and S0 will generate appropriate control signals inside the VLSM block to execute one of the four possible commands in accordance with the following table:

TABLE

| $S_0$ | $S_1$ | Function |
|---|---|---|
| 0 | 0 | INIT |
| 0 | 1 | COMPARE |
| 1 | 0 | OUTPUT |
| 1 | 1 | UPDATE |

INDEX[9:0] is the absolute address of one of the CAM words which has a match. It is normally latched inside the VLSM and is output-enabled when OUTPUT mode is selected. CAM_HIT is asserted by the VLSM when at least one CAM word has a match. This output signal is monitored by an external controller 132 (implemented by a finite state machine) to determine if the COMPARE cycle should be continued.

Referring to FIG. 13, control of the VLSM is straightforward. To find the longest match, controller 132 selects the INIT command. At the next cycle, the first character of the input string is driven onto the data bus, and the COMPARE mode is selected. If CAM_HIT is asserted, the next character will be driven onto the data bus and another COMPARE command is issued. The controller 132 repeats this step until CAM_HIT is not asserted after a COMPARE cycle. CAM_HIT also clocks the length counter 133. By then, the Index for the last character of the longest matching string in the CAM is ready, so the controller would issue OUTPUT to fetch the Index. To update one character of the history buffer, the controller drives a character onto DATA[7:0] and selects the UPDATE mode. The UPDATE cycles are further described below.

Figure 14:
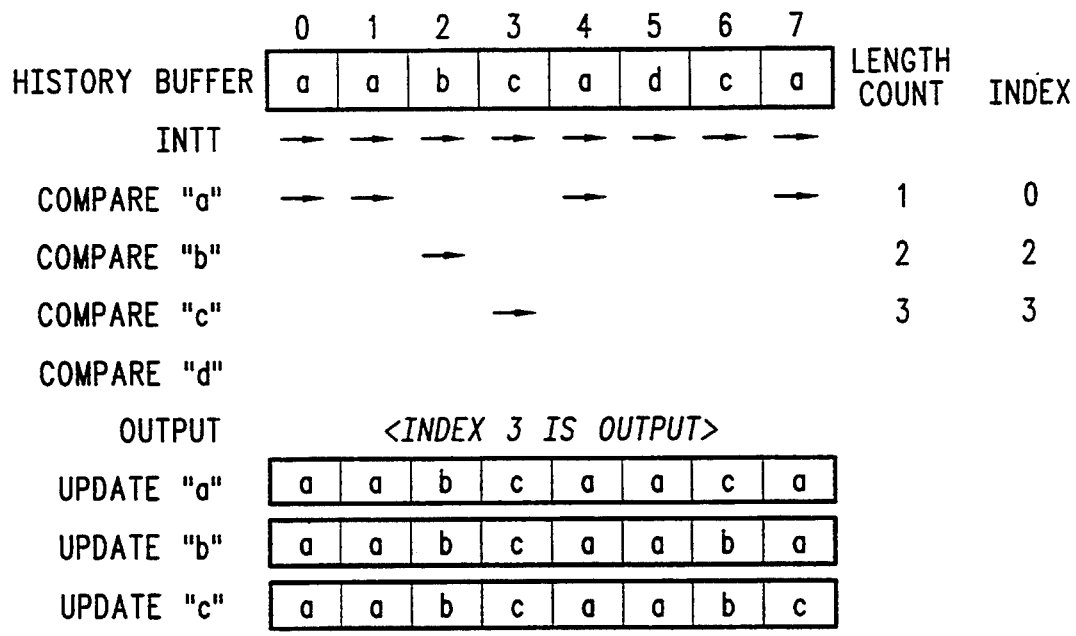
FIG. 14 is a diagram of the VLSM encoding algorithm.

During updating, the characters that were matched in the previous set of COMPARE cycles are removed from an input FIFO and are inserted into the history buffer (in the example of FIG. 14) starting at location 5. The changes in the history buffer are shown by the bold characters at the bottom right of FIG. 14. Note that the characters in locations 0–7 are not shifted left to make room for the incoming abc string. This is because these additional data transfers are avoided by writing over the oldest characters in the history buffer.

Figure 15:
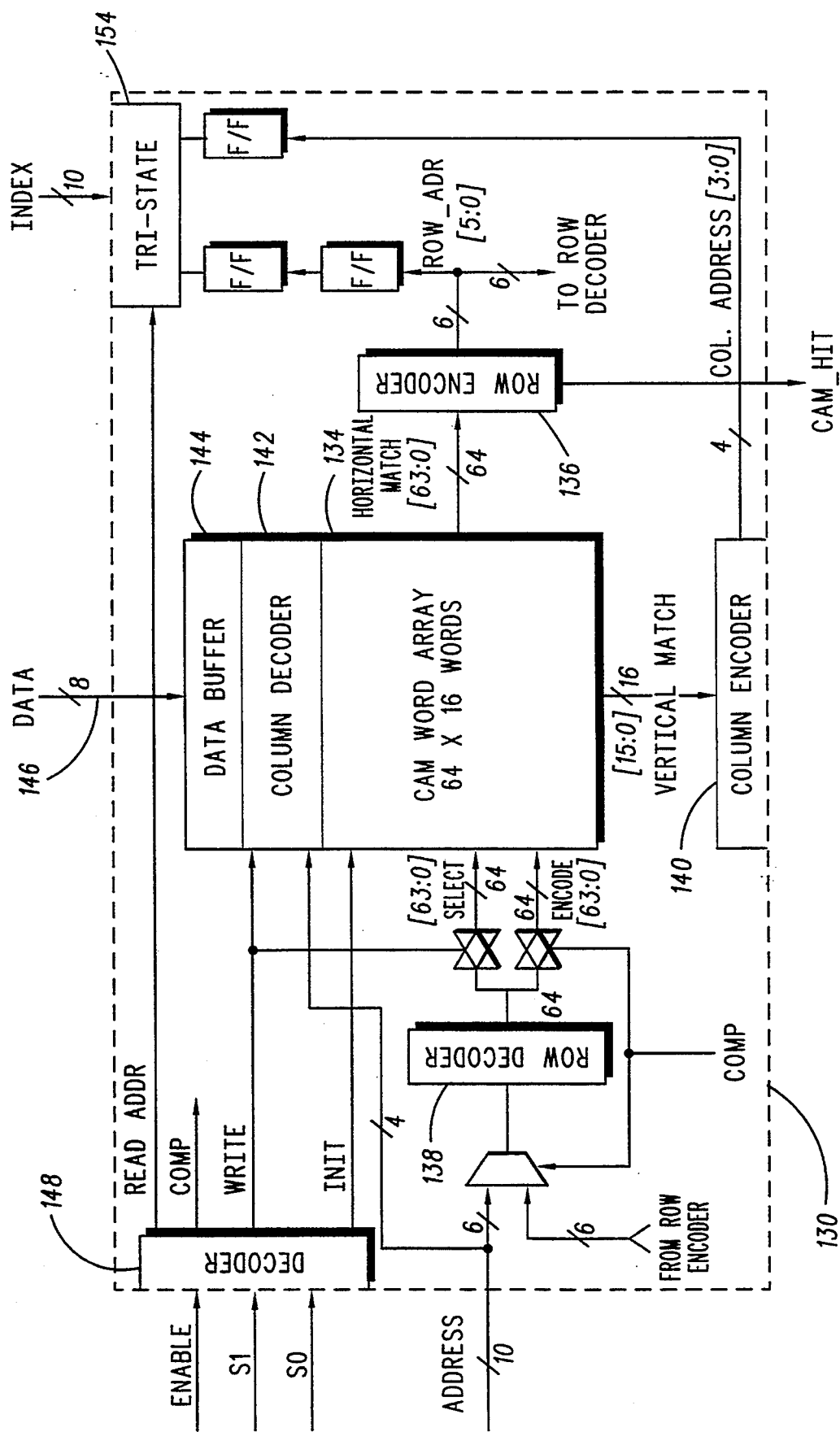
FIG. 15 is a detailed view of the functional block diagram of the VLSM hardware.

Referring to FIG. 15, internally VLSM 130 includes, as a major component, the byte associative CAM word array 134 (corresponding to FIG. 12), which serves as the history buffer and performs parallel comparison. Connected to the array 134 are a row encoder 136, a row decoder 138, a column encoder 140, and a column decoder 142. A data buffer 144 is connected between the array and the data bus 146. VLSM 130 also includes supporting logic such as the flip flops (labeled F F), the control function mode decoder 148, and multiplexers.

Decoder 140, when enabled by ENABLE, takes S1 and S2 as inputs and asserts one of four line: INIT, COMPARE, WRITE, or READ_ADDR, as appropriate. INIT goes through ever CAM word in the array.

COMP is asserted in the COMPARE cycle. It selects the ENCODE lines on the outputs of the row decoder to select a row for address encoding purpose. COMP also multiplexes the inputs to the row decoder between ADDRESS [9:4] and the output of the row encoder. WRITE is asserted in the UPDATE cycle. It enables the SELECT lines and column decoder to address one CAM word for a data write. Finally, READ_ADDR serves as the output-enable for the tristate device 154. Not shown in FIG. 15 are two non-overlapping clock signals Phi1 and Phi2 which go through each CAM word.

ADDRESS [9:0] is broken down into a 4-bit portion going into the column decoder and a 6-bit going into the row decoder. The row decoder, when enabled, asserts one of 64 lines. If WRITE is asserted, these lines will be connected to 64 SELECT lines which act as row enable during the write cycle. If COMP is asserted, the 64 ENCODE lines will assume the outputs of the row decoder.

The CAM array produces 64 horizontal H_MATCH lines and 16 vertical V_MATCH lines which go into the row encoder and column encoder, respectively. The encoders generate six and four address lines which are eventually combined to form a 10-bit Index. The Row Encoder also generates the CAM_HIT signal.

Figure 16:
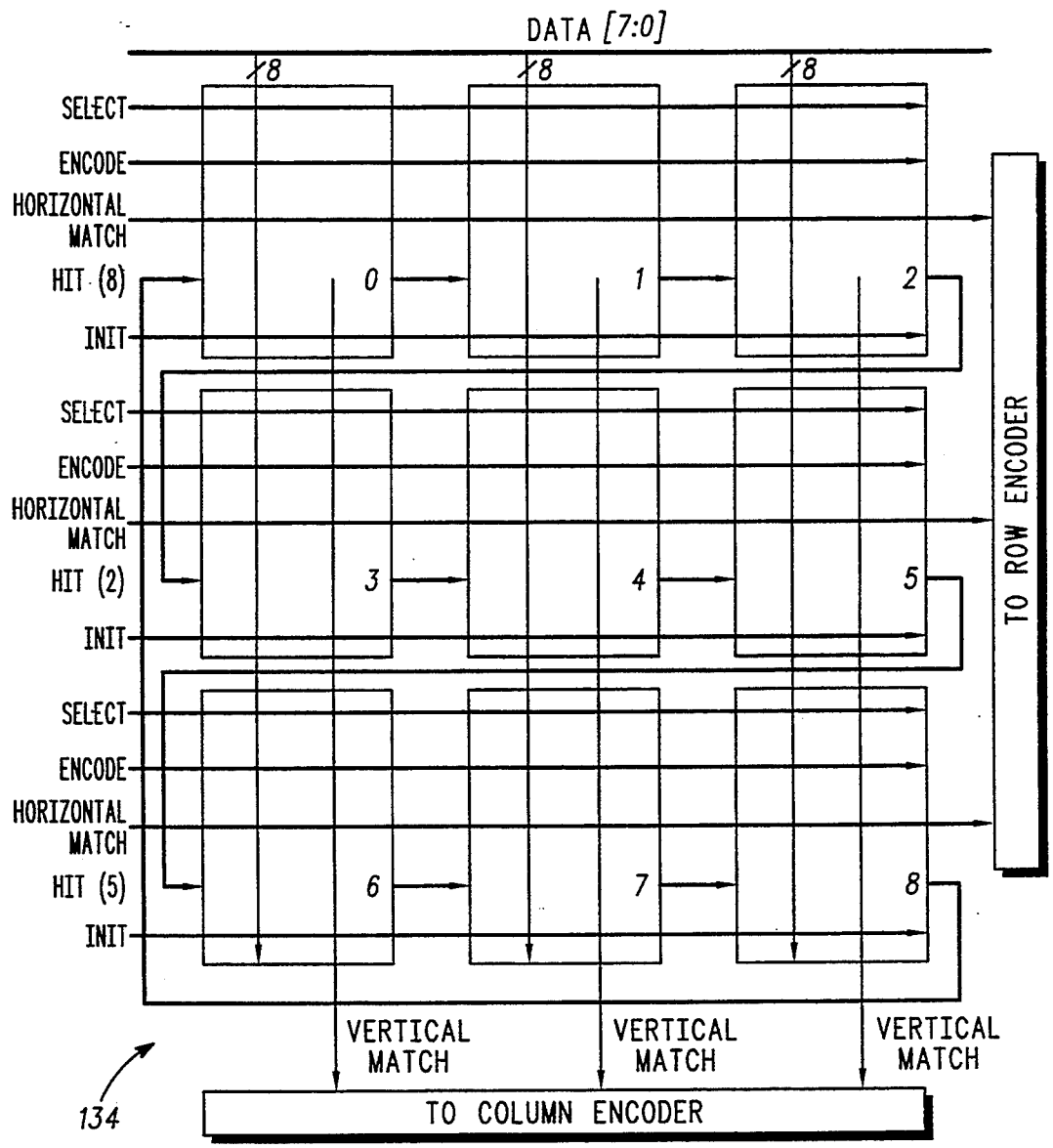
FIG. 16 is a block diagram of a CAM word array.

Referring to FIG. 16, in the CAM array 134 there are 64×16 (=1024) word cells, of which a representative set of 3×3 (=9) are shown. This two-dimensional arrangement is desirable for a compact VLSI layout especially for a large number of word cells.

As can be seen, DATA[7:0] (the eight-bit byte stream) reaches every word cell. The SELECT lines are used only during the UPDATE cycle and are high impedance during other times. The SELECT lines are connected to the outputs of the row address decoder during UPDATE cycles to enable one row for data write. The INIT is the output of decoder 148 and is fed into every word cell (FIG. 18).

The H_MATCH lines for each row and V_MATCH lines for each column are wire-ORed with all other CAM words on the same row or column and are precharged high during phi1. Each H_MATCH line is pulled low if at least one CAM word in that row has a match during phi2.

The HIT output from one CAM word is the input to its right-hand neighbor. In addition, the HIT from the highest-numbered word cell is an input to the lowest-numbered word cell. For example, the HIT output of word cell 8 is connected to the HIT input of word cell 0. In order to maintain consistent addressing, the HIT from the last word in the row has to be routed to the first word in the next row; for a large array, the wire could be very long, resulting in undesirable propagation delay. However, the wire length can be minimized if the array can be "folded" horizontally.

Figure 18:
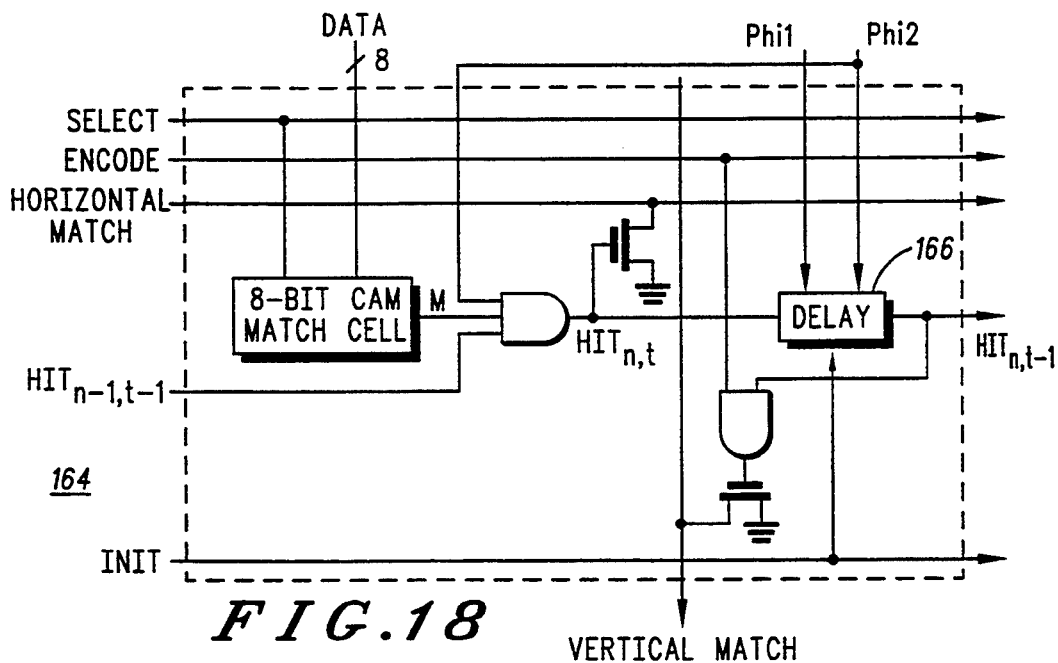
FIG. 18 is a block diagram of a CAM match cell.

The most primitive CAM structure is the CAM bit cell 160 shown in FIG. 18. It has a standard six-transistor static RAM cell topology in the upper portion, with three additional transistors that carry out the equivalence logic function in the bottom half.

Wire M is precharged high during phi1. During a match cycle, if the data on the BIT line is the same as the bit value stored in the cell, M will remain high; otherwise, M will be pulled low to indicate a mismatch. The SELECT line, when asserted, will cause the value on the BIT and BIT* lines to be written into the storage element.

Figure 17:
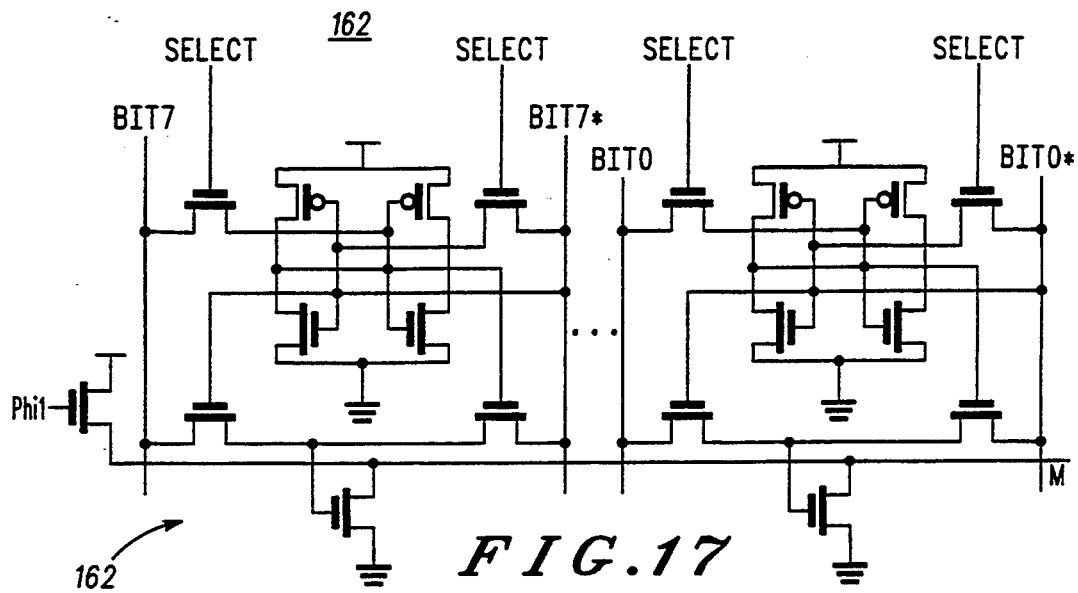
FIG. 17 is a block diagram of a CAM word cell.

Eight of the bit cells are grouped to form a CAM match cell as shown in FIG. 17. The line M is wire-ANDed in the 8-bit construction. Therefore, if at least one bit cell detects a mismatch, the M line will be pulled low.

The CAM word cell 164, which makes up the CAM array, is the next higher level of assembly. FIG. 18 shows the CAM word cell's internal structure. The CAM match cell is the largest component of the word cell; the rest are random logic and control lines.

As the logic shows, $HIT_{n,t}$ is the AND of phi2, M and $HIT_{n-1,t-1}$ which is the match result of the left word cell in the previous COMPARE cycle. $HIT_{n,t}$, if positive, will pull the H_MATCH line down, indicating a match for this word cell. $HIT_{n,t-1}$ is the one-cycle-delayed $HIT_{n,t}$ signal; in finding the longest matching string, a current match is allowed only if a CAM word cell's left neighbor had a match in the previous COMPARE cycle and the cell's content is the same as the data. The input string is presented on the data bus only one character at a time. Byte associativity depends on using the flip flop 166 to save the previous match result.

Figure 19:
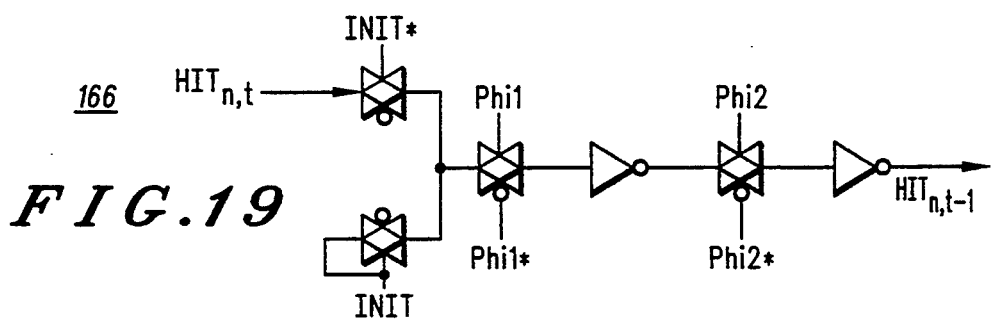
FIG. 19 is a block diagram of a delay structure.

The first character match of the input string, however, does not have to obey the left-neighbor-had-a-match rule because no COMPARE cycle has taken place yet. This is why the INIT command has to be issued first whenever a new string search begins. FIG. 19 shows the inside of the delay block 166 of FIG. 18. When INIT is asserted high, the high value is fed into the flip flop rather than the value of $HIT_{n,t}$ in the word cell. In essence, this forces the $HIT_{n,t-1}$ lines of each word cell to be high by the time the COMPARE cycle takes place, so that all words that have matches can indicate so.

Address priority encoding is necessary to VLSM and CAM because outputing a single address where the data is found is one of the CAM's attributes. Digitally, $log_2 N$ bits are necessary to specify one of N addresses. If more than one input is active at a time, conflicts need to be resolved first before binary encoding can occur. In other words, a prioritizer is needed.

First, we encode the row address so we get row address of 0, as before. Now, suppose we allow only the column matches that occur in row 0 to enter the column encoder while inhibiting the column matches in other rows. In row 0, columns 2 and 3 have matches, and the column encoder should generate an address 2. When we combine row and column addresses, an address of 2 is formed, which is correct.

Figure 20:
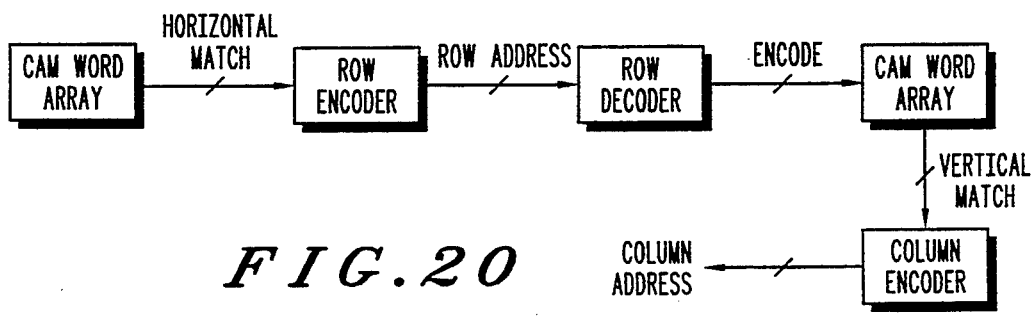
FIG. 20 is a block diagram of a priority address encoding algorithm.

The procedure described above explains the presence of the ENCODE lines found in FIGS. 16 and 18. In FIG. 18, the H_MATCH lines enter the row encoder during the COMPARE cycle. The encoded row address is then routed to the row decoder. In the same cycle, the outputs of row decoder are connected to the ENCODE lines, thereby only one ENCODE line is asserted (i.e., one row is enabled). The V_MATCH in a word cell is pulled low only if the ENCODE line for that row is asserted and $HIT_n$ is also asserted. Without this restriction, the correct lowest-numbered word cell address can not be encoded. FIG. 20 summarizes the address encoding sequence.

Note that each horizontal H_MATCH LINE is precharged high during phi1 and is wire_ORed with the word cells on the same row. It is the same for each vertical V_MATCH line except that it is wire-ORed with the word cells on the same column.

In order to uniquely and accurately encode an address, row address encoding has to take place first. The resulting row address is then routed on the row decoder, whose outputs are routed to the ENCODE lines which enable a row to propagate its vertical V_MATCH lines down to the column address encoder to encode the vertical address. The address encoder is responsible for resolving multiple matches in order to encode an unique address. There are several ways to arbitrate simultaneous responses; the one implemented in the design is priority encoding, i.e., the CAM word that has the lowest address is encoded.

Figure 21:
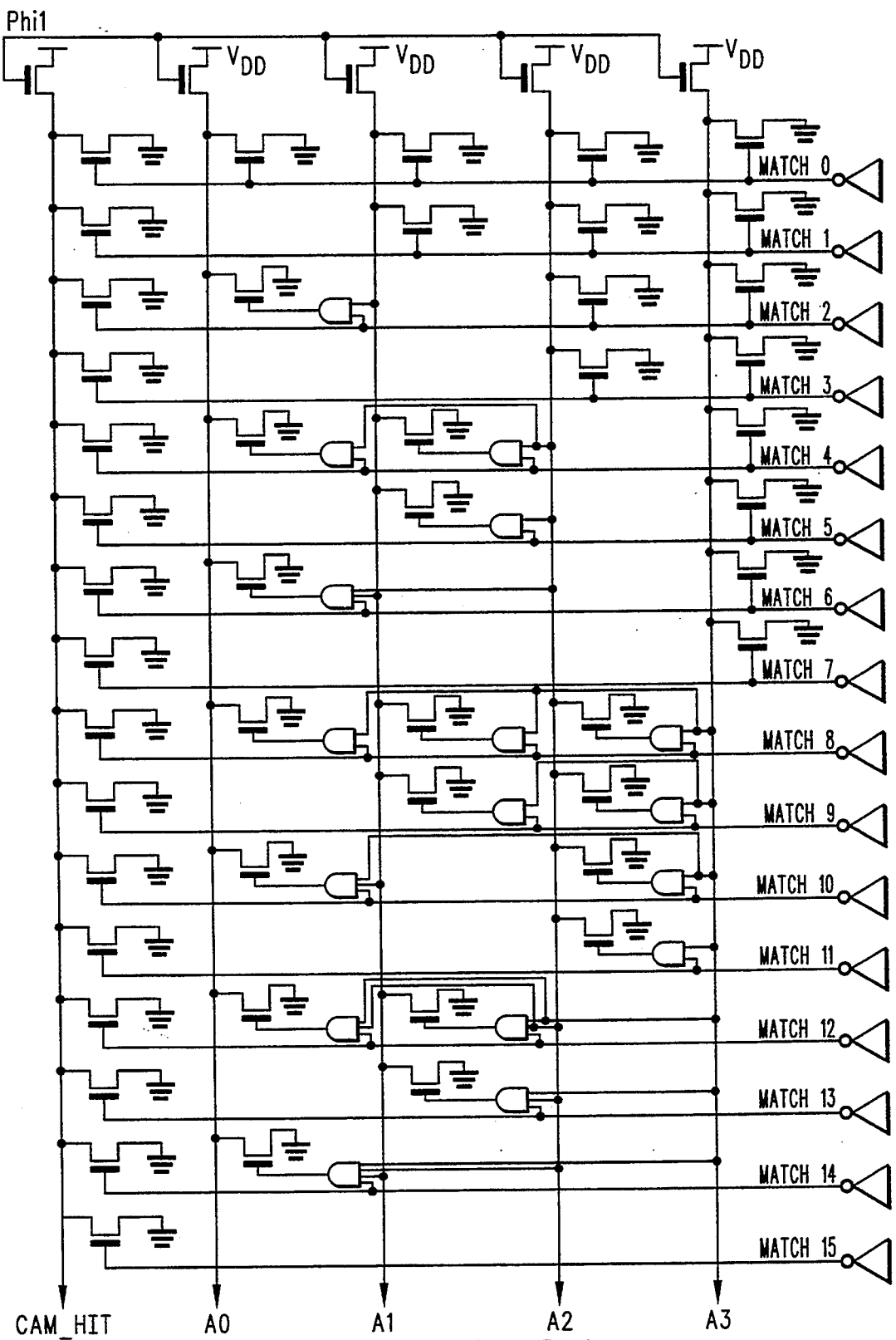
FIG. 21 is a diagram of priority address encoding hardware.

The resulting encoder 170 is constructed in a grid fashion as shown in FIG. 21. Its regularity is particularly suitable for VLSI implementation. In addition, it is a reasonably fast circuit, although it takes more area than the ripple chain approach. The design of FIG. 21 combines prioritization and binary encoding in the same structure.

The ADDR lines run vertically and are precharged high during phi1. In order to exploit the idiosyncrasy of the binary representation, the most significant bit (MSB) of the address (i.e., A3 in FIG. 21) is encoded first. Then the random logic can be designed to depend on the value of the more significant address lines. For example, the logic MATCH14 on A0 depends on A3, A2, A1, and MATCH14. A more general case is that if any of the top eight MATCH lines (encoding binary addresses ranged from 0 to 7, whose MSB's, i.e., A3, in the four-bit address are 0) is asserted, the logic for the bottom eight MATCH lines will be turned off since it is ANDed with A3. With the appropriate placement of logic, the encoder is able to encode the lowest address in the case of multiple responses.

The MATCH lines from the CAM array are buffered by inverters before they are evaluated. There are two reasons for doing so. First, the Match lines are wire-ANDed, so they need buffers to sustain their logic levels. Second, for the encoding logic to work, the MATCH lines are assumed positive logic. But in the CAM Array, MATCH lines are pulled low if matches occur. The use of inverters will reverse them to the correct polarity.

The leftmost column in FIG. 21 is responsible for generating the CAM_HIT signal. It is again a wire-ORed structure precharged high during phi1. If any one of the MATCH lines is high, CAM_HIT will be pulled low. This structure is placed in the row address encoder ONLY.

Once the codeword has been formed there may be a need for bit packing and unpacking. Bit packing refers to the bundling of normally non-byte size codewords into byte or word quantities. Bit unpacking is the inverse operation of extracting the codewords from a sequence of bytes. These operations are not as complex as finding the longest match, but they are so common that any speed-up will improve the overall throughput.

Figure 22:
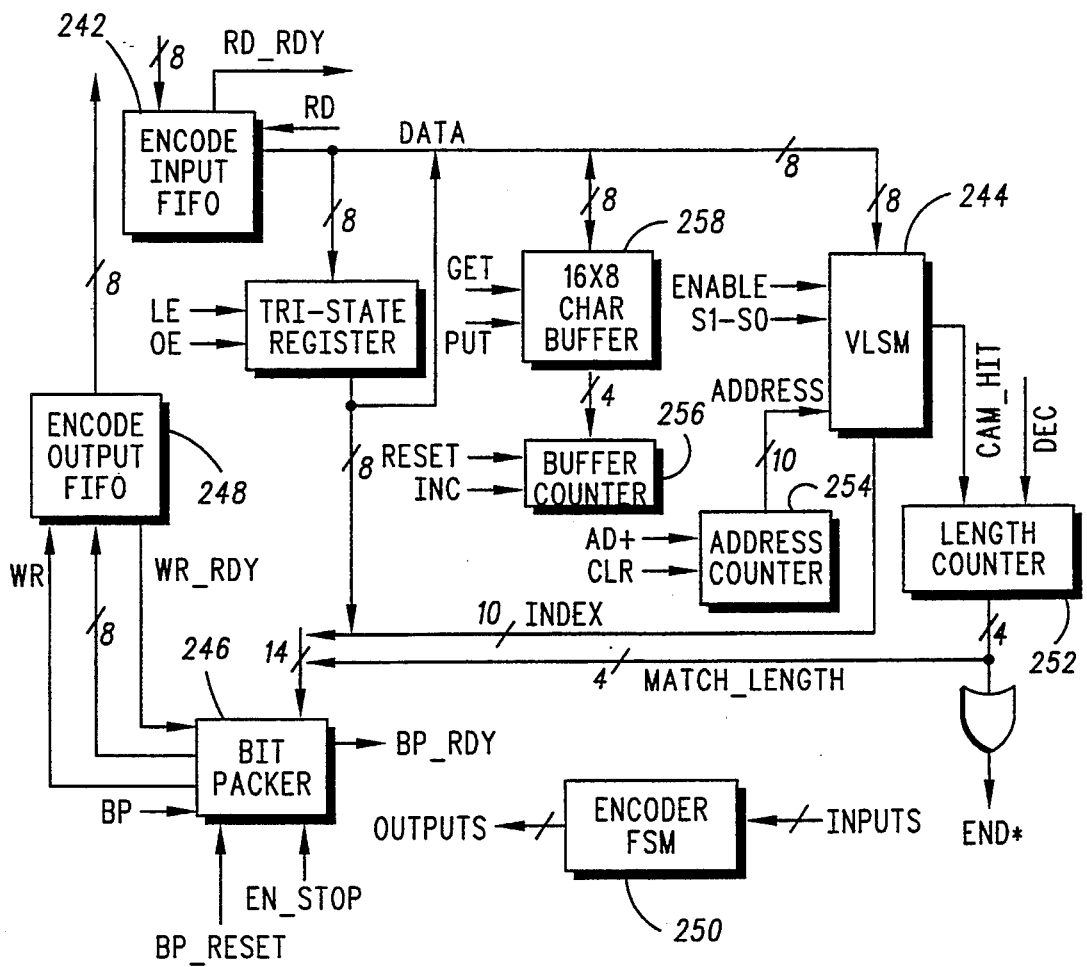
FIG. 22 is a block diagram of the encoder.

Referring to FIG. 22, in the encoder, data enters the encode input FIFO (First In First Out) 242, and travels through the VLSM 244, the bit packer 246, and finally the encode output FIFO 248. The encoder is controlled by a finite state machine, called the encoder FSM 250.

The encode input FIFO is 256-word deep and 8-bit wide. It is written by the external device and is read by the encoder. The FIFO is designed to minimize the memory management overhead required by the external devices, and contains internal logic for updating the FIFO address pointer every time a FIFO read or a write occurs. In addition, the internal logic responds to asynchronous handshake signals as well as the condition of the FIFO. For example, a byte can be read by asserting the RD signal provided the RD_RDY signal is asserted by the FIFO. Similarly, WR is asserted by the external device to write a byte into the FIFO as long as WR_RDY is positive. When the FIFO is empty or almost empty, a signal EI_EMPTY will be generated to warn the external devices which use the FIFO.

The encoder FSM (FIG. 23) generates a logical sequence of control signals to the VLSM to implicitly find the longest match and produce the codeword.

The bit packer 246 (FIG. 22) takes in 14-bit quantities and packs them into bytes. Its outputs are connected directly to the encode output FIFO. The bit packer therefore is designed to handshake with the FIFO as well. As can be seen, the 4-bit MATCH_LENGTH and the 10-bit INDEX are hard-wired as inputs to the bit packer. The output of the tri-state register could also be input to the bit packer. The tri-state register always latches the input character presented to the VLSM. If there is no match at all, i.e., MATCH_LENGTH equals zero, then the character itself is stored in the INDEX portion of the codeword. In this case, the OUTPUT command of the VLSM is never issued by the encoder FSM; instead, the content of tri-state register is fed into the bit packer in addition to MATCH_LENGTH, which is zero.

The encode output FIFO has a similar structure to the encode input FIFO, except that it has only 128 bytes and is written by the bit packer, and read by a external device. The bit packer generates WR signal to write into the FIFO. An EO_FULL signal is generated when the FIFO is full or almost full.

The length counter 252 is capable of counting up and down. CAM_HIT is the count-up clock for the counter while DEC acts as the count-down clock. The four-bit output of the length counter are inputs to the bit packer as well as an OR gate. When the outputs are all zeroes, END* is asserted low. It is used as an input to the encoder FSM.

The address counter is essentially the history buffer pointer which always points to the next position where a new input character is to be inserted into the VLSM. This 10-bit binary counter is incremented by one whenever an UPDATE command for the VLSM is executed. When it counts to 1023, it will return to zero and start again. The address counter is reset when the CLR signal is asserted.

The character buffer 258 can buffer up to 16 input characters. This is required because after the codeword is generated, each encoded input character needs to be written into the VLSM. The buffer counter 256 is cleared before a new encoding cycle begins. As each input character is read from the encode input FIFO, it is being presented to the VLSM as well as written into the character buffer, and the buffer counter is incremented to point to the next position. When the characters are about to be inserted into the VLSM, the buffer counter is reset to point to the first character. During the UPDATE cycle, the length counter is decremented as each input character is read from the character buffer and written into the VLSM location specified by the address counter. The encoder FSM will use the END* signal to determine when to conclude the UPDATE activity.

Special situations must also be handled. For example, the COMPARE cycle stops when a miss occurs, i.e., CAM_HIT is not asserted. At that point, the last character that is not part of the longest match is still in the tri-state register. The FSM has to make sure that in the next encoding cycle, the first character comes from the tri-state register, not from the FIFO.

Also, when the last character of the input sequence has been compared, a codeword must be generated even though the longest match has not been found. In other words, the encoder FSM must recognize the end of data and break the normal VLSM operating cycle by forcing an OUTPUT command to get the index. Together with the content of the length counter, the codeword is fed to the bit packer. The bit packer FSM is able to respond to such condition, i.e., if the signal EN_STOP, an input to the bit packer, is asserted, the bit packer will output the byte template even though it is not filled with 8 bits yet.

Finally, the encoder must be resetable, in which case all the counters will be cleared and the FSM will be in standby mode.

Figure 23:
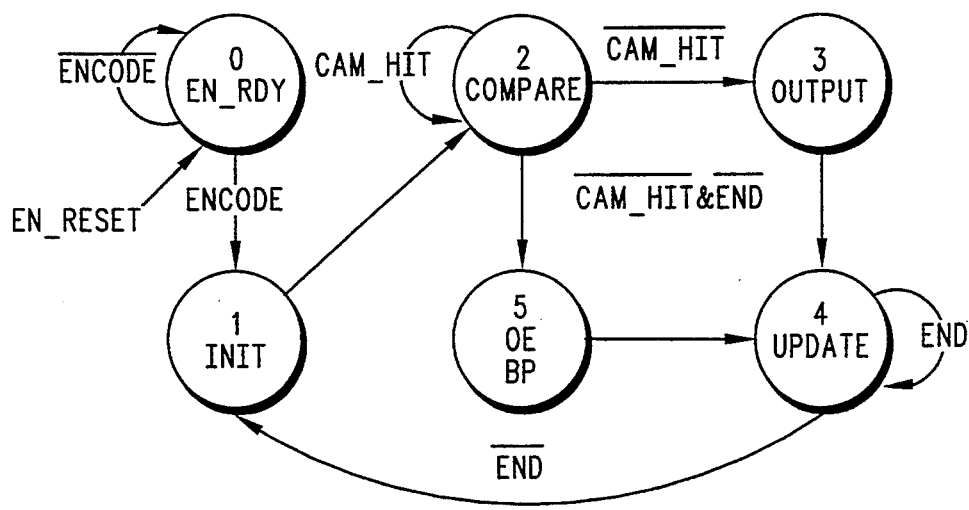
FIG. 23 is a state diagram of the encoder.

Referring to FIG. 23, the major activities of the Encoder (FSM) are shown in state diagram form.

The encoder design explained above requires the input characters to be buffered in the character buffer and then read from it later to update the VLSM. An alternative scheme would allow the input character to be inserted into the VLSM right after the COMPARE cycle, so that it does not have to be saved somewhere.

The sequence of commands issued to the VLSM would then be different. In the previously described scheme, the following commands were required for a match length of two:

INIT COMPARE COMPARE COMPARE
OUTPUT UPDATE UPDATE

In the altevative scheme, the command sequence would be:

INIT COMPARE UPDATE COMPARE
UPDATE

Since the next COMPARE cycle comes one cycle later instead of in the immediate next cycle, one more flip flop is required in each VLSM word cell to delay the match result for one more cycle.

The alternative encoder architecture made possible by the modified VLSM design is cleaner, since the character buffer and the buffer counter are eliminated. Moreover, it becomes easier to see that the OUTPUT cycle of the current encoding process and the INIT cycle of the next encoding process can actually be combined.

Other embodiments are within the following claims. The variable length string matching can be used in non-data compression applications, for example, searching character strings of a text to find a desired character string. VLSM devices can be concatenated where it is desirable to have a longer history buffer than can be provided by a single VLSM device.

We claim:

1. An encoder/decoder having a variable length string matching apparatus for finding, within a stored first sequence of data elements, a longest string of stored data elements that matches a string of a second sequence of given data elements, comprising:

encoding means, operably coupled to a storage, for generating a logical sequence of control signals to the variable length string matching apparatus, and the variable length string matching apparatus, comprising:

the storage, operably coupled to the encoding means, for storing said first sequence of data elements, comparison circuitry for comparing a single data element of said second sequence with multiple data elements of said first sequence, and for issuing match signals when matches are found, and control circuitry for causing said comparison circuitry to operate iteratively, each iteration comprising a simultaneous comparison of a data element of said second sequence with the stored multiple data elements, said control circuitry being responsive to said match signals for determining the longest string of said stored data elements that matches a string of said second sequence immediately when the match occurs, based on when an iteration does not result in issuance of a match signal by said comparison circuitry, wherein each of a plurality of cells includes at least the storage and the comparison circuitry, the cells are associated by signals between adjacent cells, the cells are provided in parallel each iteration with the data element of the second sequence for comparison and wherein said storage comprises locations each for holding one of said data elements of said first sequence, said comparison circuitry comprises a series of comparators each in a different respective one of said cells for comparing one of said data elements of said first sequence with a given data element of said second sequence and for issuing a match signal when a match is found, and delay circuitry for storing said match signal issued by a said comparator temporarily each in a different respective one of said cells for use in a next iteration on the next data element in said second sequence, wherein the variable length string matcher finds a longest match and produces a codeword in response to the logical sequence of control signals.

2. The encoder/decoder of claim 1 wherein the storage comprises storage locations for holding said data elements of said sequence, said storage locations being identifiable by absolute addresses, and the comparison circuitry simultaneously determines, immediately when the match occurs, which said storage locations hold the matching said string of stored data elements and identifies said storage locations based on their absolute addresses.

3. The encoder/decoder of claim 2 wherein said comparison circuitry comprises comparators for comparing each said data element of said sequence, as held in a said storage location, with a given data element of said second string, and address circuitry for determining and keeping track of the absolute address of at least one said storage location whose comparator indicates a match.

4. An encoding/decoding method that utilizes finding, within a stored first sequence of data elements, a longest string of stored data elements that matches a string of a second sequence of data elements, comprising the steps of:

generating a logical sequence of control signals, and finding a longest match and producing a codeword in response to the logical sequence of control signals, wherein said finding the longest match and producing the codeword includes the steps of:

storing said first sequence of data elements, comparing, simultaneously, a single data element of said second sequence with multiple data elements of said first sequence, issuing match signals when matches are found, performing said comparing step in iterations, each iteration comprising comparing a data element of said second sequence with multiple data elements in the stored first sequence, and determining, immediately when the match occurs, the longest string of said stored data elements that matches a string of said second sequence based on when an iteration does not result in issuance of a match signal, wherein the storing, comparing, and performing said comparing are performed in individual cells, and a signal is utilized to associate adjacent cells, the cells are provided in parallel each iteration with the data element of the second sequence for comparison and wherein storing includes storing at locations, each for holding one of said data elements of said first sequence, comparing includes utilizing a series of comparators each in a different respective one of said cells for comparing one of said data elements of said first sequence with a given data element of said second sequence and for issuing a match signal when a match is found, and performing said comparing includes storing said match signal issued temporarily in the step of comparing, wherein each match signal is in a different one of said cells for use in a next iteration on the next data element in said second sequence.

* * * * *